United States Patent Office

Re. 28,261
Reissued Dec. 3, 1974

28,261

INDEXED TV TUNER

Carroll R. Miner, Wilbraham, Mass., assignor to General Instrument Corporation, Newark, N.J.

Original No. 3,788,152, dated Jan. 29, 1974, Ser. No. 272,369, July 17, 1972. Application for reissue May 6, 1974, Ser. No. 467,118
Int. Cl. F16h *27/04, 35/18*
U.S. Cl. 74—10.5 46 Claims

Matter enclosed in heavy brackets [ ] appears in the original patent but forms no part of this reissue specification; matter printed in italics indicates the additions made by reissue.

ABSTRACT OF THE DISCLOSURE

A tuner for tuning a TV set or the like to a selected one of a plurality of predetermined frequencies provides, between the tuning knob and the electrical tuning element, a transmission means which functions on an indexing basis, as distinguished from a detenting basis. The transmission means is biased to rotate in one direction and a plurality of stop surfaces are presented thereto, each of those stop surfaces corresponding to a particular predetermined frequency to be tuned, the biasing means urging the transmission means into engagement with the selected stop surface, thereby to appropriately position the tuning element. When, as is preferable, a display means is provided to indicate the channel or station tuned, a low-force detenting means may be associated with the display means, but it has no significant effect on the operation of the indexing feature of the transmission means. To that end, only a fraction of the total movement of the tuning knob for effecting a shift in tuning from one station to the next is actually employed to accomplish the tuning shift, the remainder of that motion being an idling motion. A crank operating against a plate having peripheral recesses defining the aforementioned stop surfaces enables the same structure to function both to move the index means carrying the stop surfaces from one operative position to the next and to coact with the operative stop surface in order to accurately position the tuning element. Fine tuning means may be associated with the tuning means above described so functioning that a particular fine tuning adjustment, when once made, will remain effective as the tuner is shifted from one channel or station to the next. A novel positive stop permitting a very compact construction is also provided.

The present invention relates to a tuning mechanism particularly well adapted for tuning to a selected one of a plurality of TV channels, but also useful in any tuning application.

Tuners, designed when actuated to tune a receiving set such as a television receiver to a preselected one of a plurality of stations or channels are well known and take many forms. Insofar as the present invention is concerned, the precise nature of the means employed in the communications receiver itself to effect tuning to a particular reception frequency forms no part of the present invention. What this invention is directed to is the mechanism by means of which the tuning element, whatever its character, is appropriately conditioned for reception of a particular station or channel. In the past, and particularly in connection with the tuning of VHF television channels or the tuning of a predetermined small number of UHF television channels, detent-type tuning mechanisms have been employed. In these devices the detent mechanism itself provides the force and control for precisely positioning the tuning element. Since by the nature of a detent mechanism, in which a spring acts on a wedge to position the tuning element and to retain it in that position until a shift in tuning is desired, accuracy of tuning requires the use of a very stiff or strong detent spring, this in turn involves the application of appreciable force to shift the tuner from one station to another. Moreover, because of the relatively large forces involved in effecting tuning and associated operations such as display, each detent position involves structure which takes up an appreciable amount of space. Consequently, detent-type tuners have been usable only in those instances where only a relatively small number of channels or stations need be tuned. For example, with VHF television reception, there is need for only 13 positions corresponding to the available VHF channels, and it has presented no great problem to the industry to produce tuners capable of accomplishing 13 steps of tuning by detent force with sufficient accuracy and repeatability to be useful and with sufficiently low operating torques as to be acceptable to the user.

However, a need has now developed for a tuner capable of tuning all of the available UHF television in a manner comparable to that previously obtained by the VHF TV tuners of the prior art. To provide for detent tuning of the 70 or more positions, and to do this accurately by means of mechanism which may be housed in a small space, has presented a very serious problem and has resulted in many suggestions for complicated types of mechanism, all of which involved compromises in accuracy of tuning, all of which involved the application of very high operating torques, so high as to be undesirable to the normal user, and all of which involved complicated, bulky, unreliable and expensive apparatus.

Detent-type tuning, of whatever character, has not been particularly adaptable to use with motor drive, because of the problems involved in stopping the motor drive precisely at the position where accurate tuning for a given station or channel results. To use a detent to override the action of the motor involves using a very strong detent, which places a strain on the output of the motor and which makes manual tuning very difficult. On the other hand, if the detent is not strong enough to overcome the motor force and if the motor is not stopped at precisely the right position, the motor may drive the mechanism somewhat past its detent position, thereby resulting in inaccurate tuning.

Accuracy is a particular problem in connection with UHF TV tuning because the automatic frequency control circuits are capable of functioning only over a relatively limited frequency range, and unless the tuner positions the tuning element within that range for each station, the automatic frequency control circuit will not be able to perform its desired function and individuals will have to indulge in fine tuning for each channel in order to obtain acceptable reception. Of course, the object of a step-by-step tuner of the type under discussion is to eliminate the need for frequent fine tuning adjustment.

It is, therefore, the prime object of the present invention to provide for a step-by-step tuner which is capable of providing tuning in a large number of steps with a high degree of accuracy by means of simple structure and by means of structure which requires only a very low operating torque to be exerted thereon.

A second object of the present invention is to provide a multiple-position tuner which is low in cost and small in size.

It is another object of the present invention to devise such a tuner which is easily manufactured of parts not requiring any great degree of precision, which parts may readily be assembled together to produce a compact and effective tuning structure.

It is a further object of the present invention to devise a multiple-position step-by-step tuner operating on the index principle rather than on the detenting principle.

It is a further object of the present invention to devise such a tuner in which the channel read-out or other display means may function in optimum fashion without placing any undue or unrequired restrictions on the operations of the tuning system per se.

It is still another object of the present invention to devise a multiple-position tuning system which is adapted to easy manual operation and which can also be provided with motor drive without any loss of accuracy.

It is yet another object of the present invention to devise a step-by-step tuner having a limit stop mechanism of particular construction which permits a very extensive degree of movement of the tuning system parts within its desired range of operation but which effectively limits that movement at one or both of the extremes of desired movement.

In accordance with the present invention, detent-type drive between the tuning knob and the tuning element is eliminated. Step-by-step tuning accurate enough to permit the automatic frequency control circuit to take over for each tuned channel is accomplished by using an indexing principle, that is to say, the tuning element is manually moved in one direction, is biased to move in another direction, and when biased is caused to engage an appropriately positioned stop surface, with means being provided to shift the location of the stop surface relative to the remainder of the transmission means to correspond to each channel or station to be tuned. Since the biasing means in an indexing system acts on the transmission means directly rather than by means of a wedge or inclined surface, it need only be strong enough to provide the desired positive engagement between the transmission means and the stop surface, and therefore may be much weaker than the type of spring force employed in a conventional detenting mechanism. As a result the operating torque for an indexing drive is quite low. Moreover, since it is the stop surface itself which determines the position of the tuning element, a much greater degree of accuracy is achieved than with a detent type of drive. In particular, in the transmission means here specifically disclosed, while the tuning knob or other input member has a certain predetermined amount of movement for a given cycle step to shift the tuner from one station to another, only a fraction of that movement is actually involved in effecting the tuning shift, the remainder of that movement being, in effect, an idling movement. Consequently, precision of tuning is accomplished even though the tuning knob or other input member need not be moved precisely.

This last mentioned effect not only adds greatly to the accuracy of the system, but also permits the use of a relatively simple mechanism, and one which is well adapted for actuation either manually or by a motor. Further, it permits the use of a tuning indicator or display means which may be detented for positiveness of indication or display without adversely affecting the advantageous aspect of the use of an indexing system for the transmission between the input member and the tuning element. Because the tuning knob has an appreciable degree of idling movement after it has moved the tuning element accurately to its next desired tuning position, if that input member is to be motor driven and if the motor is not stopped at precisely the right point, that will have no effect whatsoever on the accuracy of the tuning accomplished by the system, provided that the point at which the motor stops is within the idling movement of the input member. Similarly, the detent active on a display element need only be strong enough to control the step-by-step position of that display element, but it will have no operative effect on the tuning element, and hence can be as weak as desired consistent with its display element detenting function.

Because of the indexing type transmission means here involved, in which the positioning of the tuning element for each desired channel or station is determined by the precise location of the corresponding stop surface on the index means, adjustability of tuning, particularly at the time of initial assembly of the set or as required in the field and accomplished by a skilled technician, may readily be accomplished by providing elements on the index means which define the stop surfaces which are themselves adjustably positionable relative to the indexing means. Hence the indexed positions may be made adjustable to conform to a desired tuning curve without causing a conflict with correct read-out dial registration.

Through using the principle of passive indexing to effect movement of the tuning element to predetermined positions, the following results are accomplished:

1. Operating torque of the system is low, resulting in ease of channel selection, superior life characteristics and low operation noise.

2. Cost of manufacture is low through the use of inexpensive parts and easy, non-exacting assembly procedures.

3. Channel read-out dials or other display elements are positioned independently of the tuner indexing means.

4. Because of the dwell angle provided in the index driving means, giving rise to idling movement thereof, motor driving of the mechanism with no loss of tuning accuracy is made easy and practical without conflicting in any way with manual operation.

A particularly effective structure for accomplishing the results described above, as here specifically illustrated, is one in which the index means comprises a plurality of plates having peripheral recesses defining the stop surfaces associated with the various channels or stations to be tuned, those plates being movable together and so relatively located and their respective peripheral recesses are rotationally staggered with respect to one another. Cooperating with those peripheral recesses is a crank having a plurality of crank arms, each arm cooperating with the peripheral recesses of a given plate so that only one crank arm is operatively associated with its respective plate at a given time. Rotation of the crank accomplishes two results—the engagement of one crank arm with its associated plate and the disengagement of the other crank arm from its associated plate, and the rotary movement of those crank arms, will move the indexing means from one operative position to the next, a surface of the peripheral recess at any time associated with a particular crank arm defining the then-operative stop surface. In addition, since the biasing means acts on the index means to tend to move it into engagement with the crank means, not only drives the index means from one position to another, as described, but also cooperates with the stop surface to cause the tuning element to be accurately positioned. By thus combining the function of the means for driving the index means from one position to another with that of the actuating means cooperating with the appropriate stop surface on the index means to accurately position the tuning element, a very efficient and simple structure results.

In a tuner of the type under discussion, stop means must generally be provided to prevent the tuning element from being moved too far in one direction or the other. A stop means may readily be incorporated into the structure of the present invention, taking up little or no additional space, permitting the mechanism to operate freely within the desired range of operation, and positively preventing it from exceeding its desired movement in either direction. A particularly effective arrangement to that end is here disclosed in which the supporting structure carries a fixed limit stop element and in which a rotatable part carries a second element designed to cooperate with the fixed limit stop element. The second element is normally urged away from the fixed element, but is designed to be moved into engagement therewith by means of a cam carried by another movable part, one which moves in a different fashion from the part which carries the second element. The cam cooperates with the second element so as to cause it to extend to a position of potential engagement with the fixed stop element many times during the operation of the tuner within its desired range, but always at a position where it does not actually engage the fixed stop element. The cam is so located and shaped that it will cause the second element actually to engage the fixed stop element only at the two desired extremes of movement of the tuner.

For purposes of summary, it may be here stated that the principle of indexing rather than detenting is employed for the positioning of the tuner because indexing has greater accuracy and longer life. If desired, detenting may be used to position the read-out dial or other display means and the control knob, because very little work is required for dial positioning, and hence the wedge force of the detent used may be quite low, low enough so as not to add appreciably to the operating torque required. Any conflict between the indexing of the tuner to an accurate tuning position and the detenting of the dial is avoided by the use of an indexing means having a dwell or idling angle of movement, this permitting the index driver to assume any position within the dwell or idling angle without any effect on the angular position of the index means and the tuner. The detent applied to the dial and control knob therefore may be imprecise, and has no effect on the accuracy of tuner indexing within the angular range of dwell or idle of the index driver. Similarly, if motor drive is provided, the accurate stopping of the motor at a particular position in order to achieve accurate tuning is no longer necessary, provided that the motor stops someplace within the angular range of the dwell or idle of the index driver.

To the accomplishment of the above, and to such other objects as may hereinafter appear, the present invention relates to the structure and arrangement of a tuning system as defined in the appended claims and as described in this specification, taken together with the accompanying drawings, in which:

Figure 1:
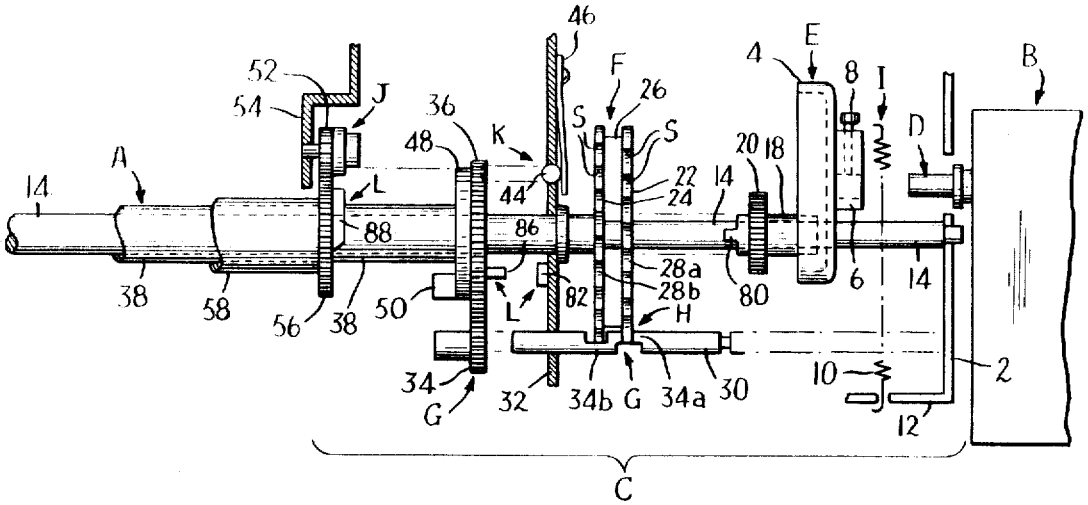
FIG. 1 is a side elevational exploded view of a preferred embodiment of the present invention.
Figure 2:
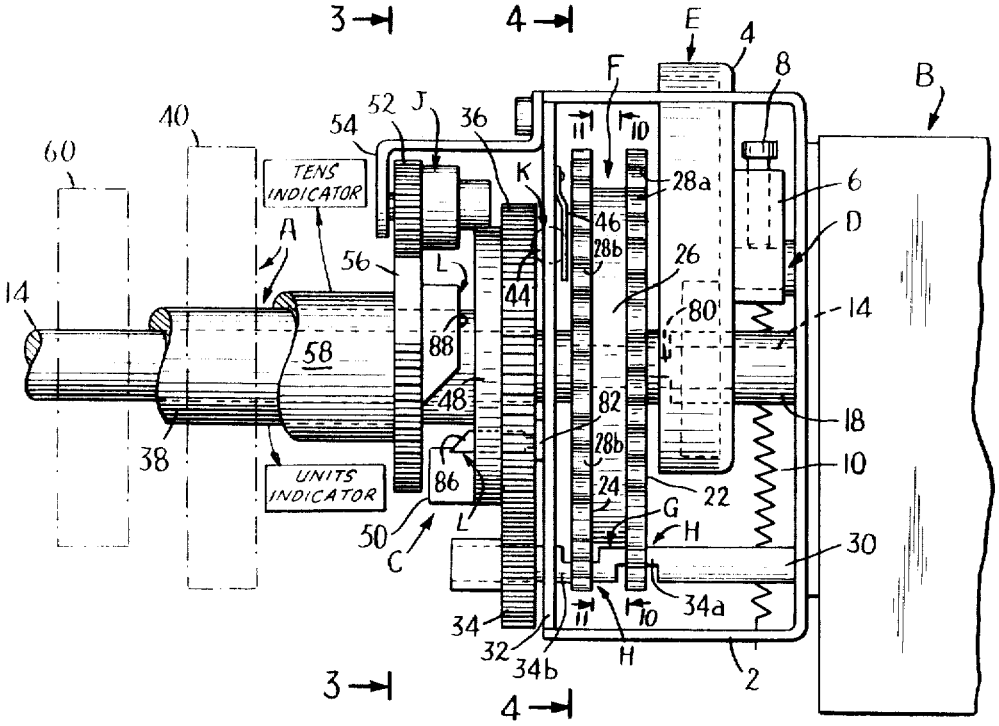
FIG. 2 is a top plan view of the tuner embodiment of FIG. 1 with the parts assembled.
Figure 3:
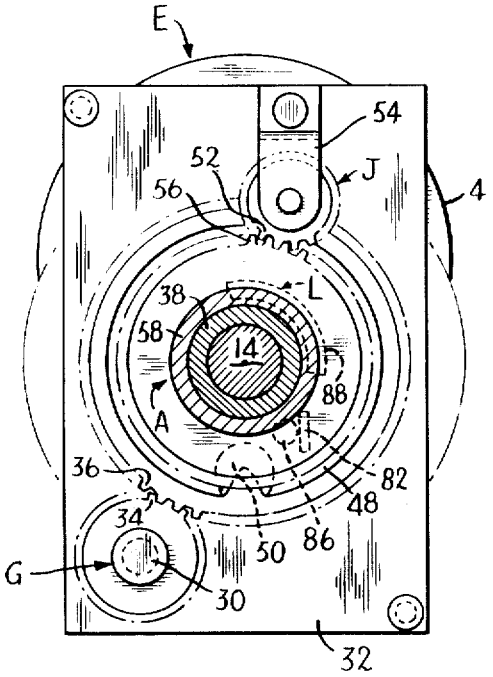
Figure 4:
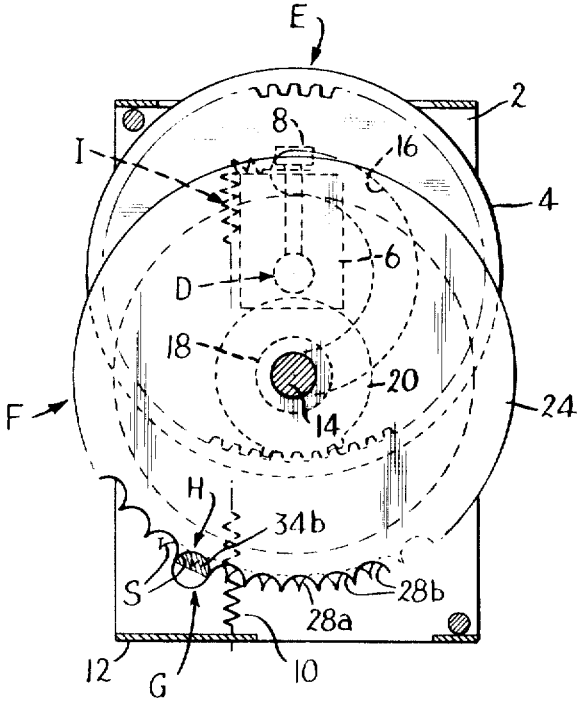
Figure 5:
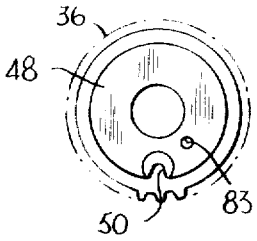
Figure 6:
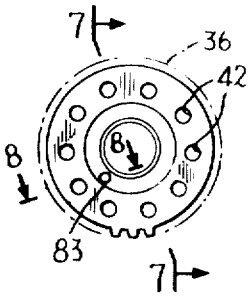
Figure 7:
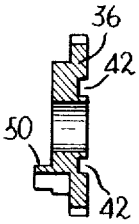
Figure 9:
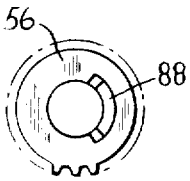
Figure 8:
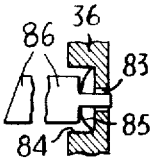
Figure 8A:
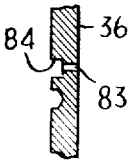
Figure 10:
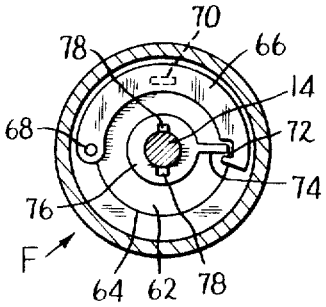
Figure 11:
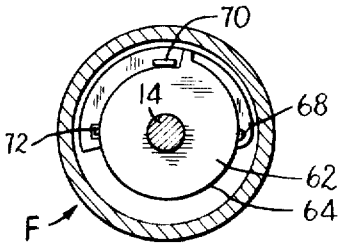
Figure 12:
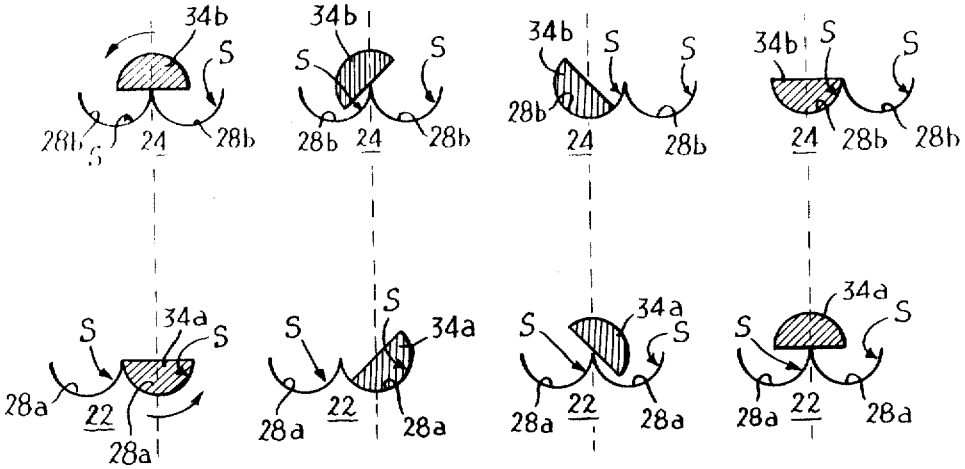
Figure 13:
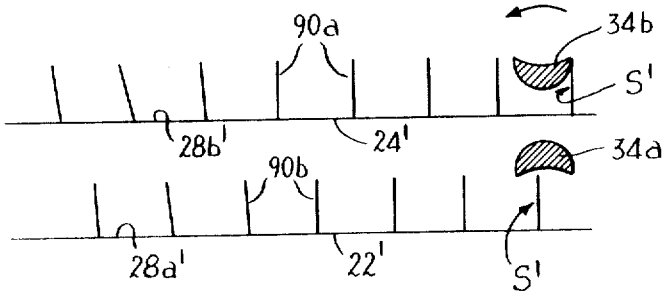
Figure 14:
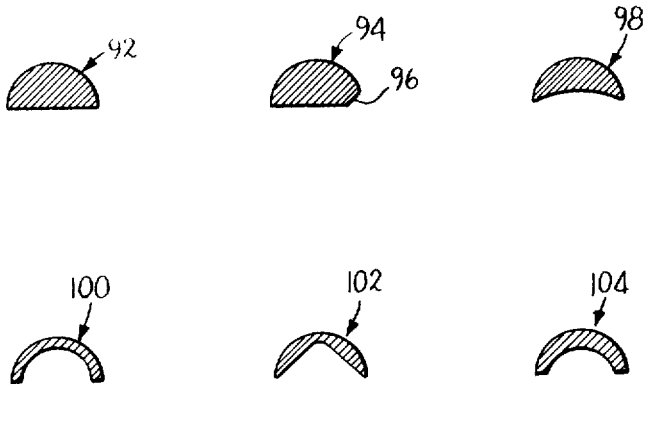

FIGS. 3 and 4 are cross-sectional views taken along the lines 3—3 and 4—4 respectively of FIG. 2;

FIG. 5 is a front-elevational view, taken from the left-hand side of FIGS. 1 and 2, of a gear located between the input member and the index wheel which carries a part of the stop mechanism and which drives the "tens" section of a decade counter display means;

FIG. 6 is a side-elevational view of the gear of FIG. 5 taken from the right-hand side thereof as viewed in FIGS. 1 and 2;

FIGS. 7 and 8 are cross-sectional views of that gear taken along the lines 7—7 and 8—8 respectively of FIG. 6;

FIG. 8a is a fragmentary cross-sectional view, on an enlarged scale, of the carrier gear-stop pin combination;

FIG. 9 is a front-elevational view, taken from the right-hand side of FIGS. 1 and 2, of another gear carrying a cam active on the stop means carried by the gear of FIG. 5;

FIGS. 10 and 11 are cross-sectional views taken along the lines 10—10 and 11—11 respectively of FIG. 2 and showing different aspects of the fine tuning mechanism;

FIG. 12 is a semi-schematic view, developed for a straight-line showing, showing the manner in which the crank arms and index means function to shift the index means from one operative position to the next as the crank arms are rotated through 180°, the crank arms and the peripheral recesses in the index means cooperating, in conjunction with the biasing means, to accurately position the tuning element. In this figure the horizontal rows represent the positions of the two crank arms respectively and the peripheral recesses in their respective associated index wheels, the four sets of vertically arranged positions showing how the respective parts are associated in various positions of rotation of the crank in shifting from one tuning position to the next;

FIG. 13 is a diagrammatic view, developed for a straight-line showing, of a two-arm crank cooperating with index means having adjustably positionable elements defining the stop surfaces, the two index means and their respective cooperating crank arms being shown in the two horizontal lines of the figure; and FIG. 14 illustrates a plurality of alternative cross-sectional shapings for the crank arms.

Broadly considered, the tuner of the present invention comprises an input member generally designated A and a tuning element generally designated B, with a transmission means generally designated C operatively connected between them, so that driven movement of the input member A is converted into appropriate movement and positioning of the tuning element B. As here disclosed for purposes of ready illustration, the tuning element B is in the form of any suitable tuning structure, such as a variable capacitor or variable inductor, having an input control shaft generally designated D. The transmission means has an output member generally designated E operatively connected to the control shaft D of the tuning element B. The transmission means comprises index means generally designated F provided with a plurality of stop surfaces generally designated S. Driving means generally designated G is interposed between the input member and the index means for rotating the latter, and actuator means generally designated H (and in the embodiment here specifically disclosed constituted by the same structural element as a portion of the driving means G) cooperates with the operative stop surface S in order to achieve accurate positioning or actuation of the tuning element B. Further functioning in that regard is a biasing means generally designated I which tends to urge the operative stop surface S of the index means F into engagement with the actuator means H for each operative position of the apparatus.

Some suitable display means (not shown) may be provided to indicate the channel or station to which the tuning element B is tuned. Driving mechanism for a digital type of display mechanism is shown, generally designated J. Detenting means generally designated K may be associated with that driving means, but it has no operative effect on the actual function of the transmission means C. In addition, a stop means generally designated L may be provided to limit the movement of the parts of the tuning system within the desired range.

In particular, it may be noted at the outset that the biasing means I need only have sufficient strength to reliably urge the index means F to move so that the appropriate stop surface S engages the actuator H in any given position of the tuner. That force need not be nearly as great as the detenting force required in a detent-type tuner, and it is only that relatively small force exerted by the biasing means I which need be overcome when the tuning system is actuated, manually, or by a power means, to shift from one tuning position to another. Also, because of the positive nature of the engagement between the operative stop surface S and the actuator means H, the tuning position is accurately achieved with minimal wear. This is to be contrasted with a detent-type operation, where it is the detent mechanism, a mechanically relatively inefficient system, which provides the force for moving the parts to a given operative tuning position. The forces involved in detent-type tuning systems are much greater than those here involved, and hence require the exertion of much greater forces in order to shift the mechanism from one tuning position to the other. Moreover, because of the high pressures and great frictional forces involved in detent mechanisms, they tend to wear relatively rapidly and hence lose their accuracy and reliability over a period of time.

Turning now to a more detailed description of the preferred embodiment here specifically disclosed, the tuning element B is secured in any appropriate manner to a mounting bracket 2, with its control L shaft D extending through that bracket. Mounted fast on the control shaft D is the output member E of the transmission means C, here shown in the form of an internal gear 4 made fast on the control shaft D by means of a hub 6 and set screw 8. The biasing means I, in the form of an extended tension spring 10, is attached at one end to the set screw 8 and is attached at its other end to an arm 12 extending from the bracket 2, the action of the biasing spring 10 being such as to cause the gear 4 to tend to rotate in a particular direction.

A central supporting element 14 is mounted on the bracket 2 and extends out therefrom to the left as viewed in FIGS. 1 and 2. Freely mounted on the part 14 is a sleeve 18 carrying pinion 20, which pinion is received inside gear 4 and engages the latter in driving relationship, it is operatively connected to the index means F so as to rotate with the latter. The gear 4 is provided with a slot 16 through which the parts 14 and 18 extend, thereby permitting the gear 4 a desired degree of rotation movement less than 360°, and here shown as approximately 180°.

The index means F is likewise freely rotatably mounted on the part 14. It comprises a pair of plates 22 and 24 connected by flange 26 so as to rotate as a unit. The periphery of each of the plates 22 and 24 are provided with scallop-shaped recesses 28a and 28b respectively, and the plates 22 and 24 are so rotationally mounted relative to one another that the scallops 28a and 28b are staggered rotationally relative to one another, as may be seen from FIGS. 2 and 4, and particularly as shown in the developed view of FIG. 12.

Crank shaft 30, forming a part of the driving means G and the actuator means H, is rotationally mounted between bracket 2 and a support plate 32, and is provided with a pair of crank arms 34a and 34b which register respectively with the plates 22 and 24 and which are so radially positioned relative to the scalloped recesses 28a and 28b that as the crank shaft 30 is rotated the crank arms 34a and 34b respectively move into and out from the recesses 28a and 28b respectively. The shaft 30 carries on its left-hand end a pinion 34 which meshes with a gear 36 carried at the end of sleeve 38, the gear 36 and sleeve 38 being freely rotatably mounted on member 14. The sleeve 38 extends out to the left as viewed in FIGS. 1 and 2, constitutes the input member A for the tuner, and may have a tuning knob 40 secured thereto in any appropriate manually accessible position. The element 40 may also, if desired, be in the form of a gear which is operatively connected to some appropriate power drive, such as an electric motor. In any event, it and the sleeve shaft 38 constitute the input means A to the tuning mechanism.

As the shaft 38 is rotated, gear 36 drives pinion 34 and rotates shaft 30. What happens when shaft 30 is rotated is best illustrated in FIG. 12 in which the upper horizontal line illustrates the relative positions of the crank arm 34b and the recesses 28b and the lower horizontal line represents the positions of the crank arm 34a and the recesses 28a. The left-hand pair of vertical diagrams in FIG. 12 represent the positions of the parts as shown in FIG. 1, with crank arms 34a received within a recess 28a and with crank arm 34b being located beyond the periphery of index plate 24 and therefore out of the recesses 28b. With the parts in this initial position, the action of the spring 10 defining the biasing means I causes the index means F to rotate until one side of the recess 28a (defining the stop surface S) in which the crank arm 34a is received is pressed up against the crank arm 34a, that crank arm therefore constituting the actuating means for the indexing system which indexes the position of the index means F and consequently precisely locates the control shaft D of the tuning element B for actuating the latter to tune to a particular station.

If now the crank 30 is rotated in a counterclockwise direction as viewed in FIG. 12, the first approximately 45° of rotation will produce the result shown in the second vertical pair of drawings from the left in FIG. 12. The crank arm 34b has moved partially into the left-hand recess 28b and the crank arm 34a has moved partially out of the recess 28a, but there has not yet been any movement of the index means F because of the still partial engagement between the crank arm 34a and the stop surface S of recess 28a.

The next pair of vertical drawings in FIG. 12 show the position of the parts after the crank shaft 30 has rotated approximately 90° from its previous position. By this time crank shaft 34a has moved out of the recess 28a in which it formerly was received, and this has permitted the biasing means 10 to move the index means F to the right as viewed in FIG. 12. However, as soon as crank shaft 34a comes out of recess 28a, crank shaft 34b enters recess 28b, thereby to limit the spring-urged movement of the index means F, and consequently of the control shaft D for the tuning element B, to a predetermined degree of movement defined by what in FIG. 12 is the right-hand or stop surface S of recess 28b in which the crank shaft 34b is received. When the crank shaft 34b is in the position shown in this third set of drawings in FIG. 12, indexing of the tuner to the next stage of tuning has been accomplished accurately and effectively.

Thereafter continued rotation of the crank shaft 30 from the position of the parts shown in the third set of drawings in FIG. 12 to the position shown in the fourth set of drawings brings the crank shaft 30 to a neutral position, but that movement is accomplished without any movement of the index means F and hence without any movement of the control shaft D or the tuning element B. Consequently the movement of shaft 30 from the position shown in the third set of drawings in FIG. 12 to that shown in the fourth set of drawings in FIG. 12 constitutes a dwell or idling movement, as does the movement of the parts from the first set of drawings in FIG. 12 to the second set of drawings in FIG. 12. The index means F defined by the recess plates 22 and 24, is positively rotated against the force exerted by the biasing means I, by engagement of the crank arm 34b with the plate 24, and it is likewise the engagement between the crank arm 34b and the plate 24 which fixes the new rotated position of the index means F. On the next 180° rotation of the crank shaft 30 the same sequence of operations ensues, except that it will then be the crank arm 34a engaging with the plate 22 which causes the index means F to move, those same two parts then functioning, in conjunction with the biasing means I, to fix the operating parts in their next indexed position.

It is usually considered desirable that the tuning knob 40 be provided with a detent mechanism so as to give the operator of the tuner a "feel" that he has moved from one position of the tuning to the next. To that end, in the present system, the right-hand surface of the gear 36, as viewed in FIGS. 1 and 2, and as best seen in FIG. 6, may be provided with a plurality of recesses 42 equally angularly spaced relative to one another, and the supporting plate 32 may be provided with a detent ball 44 urged into engagement with the recessed surface of the gear 36 by means of leaf spring 46, all of which constitutes the detenting means K. This leaf spring 46 may be quite weak, only strong enough to provide the desired "feel" to the operation of the tuning knob 40, and it plays no part whatsoever in fixing or determining the tuned position of the control shaft D for the tuning element B.

The gear 36 may also be employed to drive any suitable display or indicating means by means of which the operator will be apprised of the particular station or channel to which the tuner is set. The detenting means K defined by the recesses 42, the detent ball 44 and the leaf spring 46 will likewise provide detenting for that indicating or display mechanism. In the form here specifically disclosed it is contemplated that the tuner will be used in conjunction with a digital type indicator, because of the fact that the tuner is adapted for tuning 70 different stations or channels. The sleeve 38 may drive or carry the "units" indicator of the decade counter. The gear 36 may have on its left-hand face as viewed in FIGS. 1 and 2 a conventional lock and key drive comprising lock 48 and key 50, the latter engaging pinion 52 mounted on bracket 54 and rotating it one step for each full rotation of the gear 36. The pinion 52 in turn meshes with gear 56 to which sleeve 58 is secured, the gear 56 and sleeve 58 being freely rotatably mounted on sleeve shaft 38, the sleeve 58 driving or carrying the "tens" indicator of the decade counter. From this it will be seen that the detent means K active to detent the input knob 40 is also active to detent the various parts of the display means, whether of the decade type or otherwise.

It has been pointed out previously that rotation of the index means F is transmitted via gear 20 and gear 4 to the control shaft D of the tuning element B. The connection between the index means F and the gear 20 may be a rigid connection if desired. However, it is usually necessary to provide some means for fine tuning in a tuner of this type, and that fine tuning means is, as here disclosed, interposed between the index means F and the gear 20, so that some control of the relative position of the gear 20 with respect to the index means F may be achieved. To that end, as here specifically disclosed, the shaft element 14 on which many of the parts of the tuner and particularly the transmission means C thereof, are mounted, is itself a rotatable shaft providing for the fine tuning of the tuner, and it may be provided at its left-hand end with an accessible tuning knob 60. As may best be seen from FIGS. 10 and 11, the shaft 14 passes through the index means F. There it carries, operatively rotationally fixed thereto, a cam 62 having a spiral cam surface 64. Mounted within the index means F is an arcuate arm 66, that arm being pivotally connected at 68 to one of the plates 22 or 22 or 24, having a cam follower lug 70 extending out therefrom so as to ride on the cam surface 64, and having a notch 72 at its free end. Thus it will be seen that as the index means F rotates the arm 66 will rotate with it, but that as the cam 62 is rotated by the shaft 14 the relative position of the arm 66 with respect to the index means F will vary. Received within the notch 72 is finger 74 extending from sleeve 76 freely rotatably mounted on shaft 14, that sleeve 76 having keyways 78 for receiving the keys 80 extending from the sleeve 18 on which the gear 20 is mounted. The cam 62 is made large enough so that the friction between it and cam follower 70 is sufficient to cause cam 62 and shaft 14 to rotate along with the index means F when the latter is rotated. Hence rotation of the index means F is transmitted through arm 66 and sleeve 76 to the gear 20 during normal step-by-step tuning from one station to the next, and without any loss of the fine tuning adjustment that has been made. If, however, some fine tuning adjustment is required for a given tuner setting, rotation of the fine tuning knob 60 will cause shaft 14 and cam 62 to rotate, thereby to cause the position of arm 66 relative to the index means F to change by pivoting about axis 68, thereby to impart a slight degree of movement to gear 20 in order to produce the desired degree of fine tuning adjustment.

In the specific embodiment here disclosed, the gear 36 will make one complete rotation for every 10 channel or station positions, and consequently 10 equally spaced detent recesses 42 are provided in that gear. This is particularly desirable when the indicating or display mechanism is in decade form. Each of the index plates 22 and 24 may be provided with 35 equally spaced scalloped recesses 28a and 28b respectively which, as has been previously stated, are rotationally staggered one with respect to the other. Consequently, to tune 70 channels only a 360° rotation of the index means F will be required since 70 distinct stop surfaces defined by portions of the 70 separate recesses 28a and 28b are provided. The crank shaft 30 need rotate only 180° for each tuning position shift. It will be noted that because of the use of two index plates 22 and 24 the number of individual recesses 28 which must be provided on any given plate is only a fraction of the total number of stations or channels to be tuned, and hence index plates 22 and 24 of relatively low radius can be employed.

It will be appreciated from the above that the gear 36 will rotate seven times in order to drive the tuner through its desired range of operation. This presents a problem insofar as providing a limit stop is concerned. That problem is solved in the construction here disclosed in a very effective manner, taking up no additional space and involving very little additional complexity to the structural arrangement. To that end, a tab 82 is struck out from the supporting plate 32 on the face thereof opposite the gear 36. That gear 36 is provided with a through passage 83 leading to a countersunk portion 84, and in that through passage 83 a headed stop pin 86 is mounted, the head being received in the countersunk area 84, and suitable spring means 85 (see FIG. 8a) is mounted on the gear 36, between the head of the pin 86 and the bottom of the countersink 84, so as to tend to urge that pin to the left, thereby withdrawing the tip of the pin to the left and out of the path where it might engage with the tab 82. The gear 56 is located immediately adjacent the left-hand side of gear 36, and it is provided with a raised cam surface 88 against which the spring-urged head of the pin 86 is adapted to be urged. The gear 56 rotates at a different rate of speed from the gear 36. When the head of the pin 86 engages with the raised portion of the cam 88, it is pushed out to the right against the action of the spring and into a path of movement which might interfere with the tab 82, but when the head of the pin 86 is not engaged with the raised portion of the cam 88 the spring withdraws it so that it can move freely past the tab 82 without engaging it. The cam 88 is so located on the gear 56, and is of such a circumferential extent, that when the parts of the tuner are at one extreme or the other of their desired degree of movement the stop pin 86 will be projected out to the right at a time when it will also be moved into engagement with the tab 80, thereby positively stopping rotation of the tuner parts. On the other hand, while the tuner is being moved within its desired range of operation, the stop pin 86 is projected out to the right by engagement with the cam BB only in those rotational positions where it can move idly in and out without being brought into engagement with the part 82.

Since the position of the control shaft D of the tuning element B is, for a given operative position of the tuner, determined by the relative positions of the actuating means H (the crank arms 34a and 34b) and the stop surfaces S defined by the recesses 28a and 28b in the index means F, it is possible to provide means for adjusting the tuning for non-uniform movement of the operative parts between different operative positions. One way in which this may be accomplished is schematically illustrated in FIG. 13, which is a developed view of a pair of index plates 22' and 24' the recesses 28a' and 28b' of which are defined between bendable tabs 90a and 90b on the periphery of the plates 22' and 24' respectively. By bending those tabs 90a and 90b within limits adjustments may be accomplished in the indexed positions of the index means F as the crank shaft 30 rotates. Hence non-linear or even arbitrary relationships between frequency tuning and channel selection may be accomplished.

FIG. 14 illustrates different alternative cross-sectional shapes for the crank arms 34a and 34b respectively. They may, for example, be semicircular in cross-section, as indicated at 92, and they may be mainly semicircular in cross-section, as indicated at 94, with the trailing edge chamfered at 96 to prevent jamming of the crank arms 34a and 34b as they are rotated. When adjustable tabs 90 are employed, as in FIG. 13, it may be desired to provide the crank arms with a crescent shape, as shown at 98, in order to provide for the greatest degree of adjustability of the tabs 90 without interfering with the crank arms 98. The shapes 100, 102 and 104 represent coined or swaged shapes which may be made at minimum cost, but with some possible sacrifice in strength.

In the embodiment here illustrated, the index means F makes but a single rotation to provide for the entire range of tuning. This is by no means necessary, although it does permit the accomplishment of a large number of tuning stations with a minimal sized mechanism. If an even greater number of tuning stations are required, the index means F could be so designed as to make more than a single rotation, or even a plurality of rotations, in somewhat the same manner as detent-actuated wheels have been employed in prior art tuners. The recesses 28 are here disclosed primarily as semicircular in shape, but this too is not essential, and indeed, the tips of the plates 22 and 24 between successive recesses 28a and 28b respectively, may be somewhat truncated in order to provide for better clearance between the index plates 22 and 24 and the crank arms 34a and 34b as the crank shaft is rotated. The receses need not be circular in configuration, and indeed, it is sometimes preferred to make them deeper at the bottom than along the sides, in an ellipse or oval shape, as a substitute for or in addition to the chamfer 96 of shape 94 in FIG. 14.

Through the use of an indexing system rather than a detenting system a tuner is produced which has no high pressure, high torque or high friction points during its operation, and in which manual manipulation is therefore simple, easy and uniform. The index means F does not do any actual work in accurately positioning the output number E in the sense that a detent wheel performs work to accomplish "pull-in" and to move the read-out or display elements of the system. Instead, the positioning work is accomplished by the driving means G and actuator H cooperating with the index means F in conjunction with the biasing means I. The tuner is positioned by the index means F but with a dwell or idling movement in the input drive, thus permitting the detent means K active on the input knob 40 and on the display or indicating means J to perform its work without in any way conflicting with the effective, accurate and long-lived drive for the tuning element B. In the process of channel change, the index-type transmission means C causes the tuner B to reach its channel frequency before the detent means I has puled in, and the tuning setting is retained during the movement that is required for the detent means K to be pulled in. Thus a tuning system is produced which uses indexing for accurate and reliable tuning and which uses detenting for "knob feel" and for channel display, with the best aspects of each system being employed where appropriate and without requiring any compromise in the operation of the other system.

While but a single embodiment of the present invention has been here specifically disclosed, it will be apparent that many variations may be made therein, all within the scope of the instant invention as defined in the following claims.

I claim:

1. A tuning assembly comprising an input member, an output member, a tuning element operatively connected to said output member to be positioned thereby, and transmission means operatively connected between said members and comprising index means operatively connected to said output member for movement therewith, a plurality of stop surfaces respectively corresponding to operative and positions for said tuning element, actuator means operatively connected to said input member and movable thereby to positions engaged by successive stop surfaces, biasing means operatively connected to said index means for urging said index means in a direction to cause said top surfaces to engage said actuator means, and driving means operatively connected between said input member and said index means for moving the latter to bring successive stop surfaces into engagement with said actuator means.

2. The tuning assembly of claim 1, in which said input member moves a predetermined amount to shift said tuning element from one operative tuning position to the next and thereafter idly moves a second amount before commencing the next cycle of shifting of said tuning element.

3. In combination with the tuning assembly of claim 2, display means for identifying the operative tuning position of said tuning element, a driving connection between said tuning element and said display means, and detent means operatively active on said display means for detenting it in its various display positions, said detent means being independent of and inactive on said transmission means.

4. The combination of claim 3, in which said detenting means is active on said input member in advance of said transmission means.

5. In combination with the tuning assembly of claim 1, display means for identifying the operative tuning position of said tuning element, a driving connection between said tuning element and said display means, and detent means operatively active on said display means for detenting it in its various display positions, said detent means being independent of and inactive on said transmssion means.

6. The combination of claim 5, in which said detenting means is active on said input member in advance of said transmission means.

7. The tuning assembly of claim 2, in which said actuator means and said driving means comprise the same physical element.

8. The tuning assembly of claim 7, in which said actuator-driving means comprises a crank which, when rotated, engages with successive stop surfaces to cause said index means to move, thereby to comprise said driving mean, said biasing means thereafter urging the operative stop surface against said crank, said crank thereby comprising said actuator means.

9. In combination with the tuning assembly of claim 7, display means for identifying the operative tuning position of said tuning element, a driving connection between said tuning element and said display means, and detent means operatively active on said display means for detening it in its various display positions, said detent means being independent of and inactive on said transmission means.

10. The combination of claim 9, in which said detenting means is active on said input member in advance of said transmission means.

11. The tuning assembly of claim 1, in which said actuator means and said driving means comprise the same physical element.

12. The tuning assembly of claim 11, in which said actuator-driving means comprises a crank which, when rotated, engages with successive stop surfaces to cause said index means to move, thereby to comprise said driving means, said biasing means thereafter urging the operative stop surface against said crank, said crank thereby comprising said actuator means.

13. In combination with the tuning assembly of claim 11, display means for identifying the operative tuning position of said tuning elements, a driving connection between said tuning element and said display means, and detent means operatively active on said display means for detenting it in its various display positions, said detent means being independent of and inactive on said transmission means.

14. The combination of claim 13, in which said detenting means is active on said input member in advance of said transmission means.

15. The tuning assembly of claim 1, in which said driving means comprises a crank, said index means being rotatable and having said stop surfaces on the periphery thereof, said crank, when rotated, engaging with successive stop surfaces of said index means to rotate the latter.

16. The tuning assembly of claim 15, in which said crank comprises a plurality of circumferentially spaced crank arms, there being a plurality of said index means operatively connected to said output member, said crank arms cooperating with said index means respectively.

17. In combination with the tuning assembly of claim 15, display means for identifying the operative tuning position of said tuning element, a driving connection between said tuning element and said display means, and detent means operatively active on said display means for detenting it in its various display positions, said detent means being independent of and inactive on said transmission means.

18. The combination of claim 17, in which said detenting means is active on said input member in advance of said transmission means.

19. The tuning assembly of claim 1, in which said index means comprises elements defining said stop surfaces which are adjustably positionable relative to said index means proper.

20. The tuning assembly of claim 2, in which said index means comprises elements defining said stop surfaces which are adjustably positionable relative to said index means proper.

21. The tuning assembly of claim 5, in which said index means comprises elements defining said stop surfaces which are adjustably positionable relative to said index means proper.

22. The tuning assembly of claim 11, in which said index means comprises elements defining said stop surfaces which are adjustably positionable relative to said index means proper.

23. A tuning assembly comprising an input member, an ouput member, a tuning element operatively connected to said output member to be positioned thereby in a plurality of tuning positions, and transmission means operatively connected between said members, *and effective to cause said output member to move in a direction and to a degree directly related to the direction and degree of movement of said transmission means,* detent means operatively active on said input member in advance of said transmission means for detenting said input member in a plurality of operative positions with a predetermined degree of input member movement between said operative positions, said transmissions means being active to move said tuning element to a given operative position upon movement of said input member to a degree less than predetermined degree and to retain said tuning element in said given operative position as said input member moves the remainder of said predetermined degree of movement.

24. In the combination of claim 23, display means for identifying the operative tuning position of said tuning element, said display means being drivingly operatively connected to said input member.

25. A tuning assembly comprising an input member, an output member, a tuning element operatively connected to said output member to be positioned thereby in a plurality of tuning positions, and transmission means operatively connected between said members, detent means operatively active on said input member in advance of said transmission means for detenting said input member in a plurality of operative positions with a predetermined degree of input member movement between said operative positions, said transmission means being active to position said tuning element in one direction, and biasing means active on said tuning element to tend to move it in the opposite direction.

26. In the combination of claim 25, display means for identifying the operative tuning position of said tuning element, said display means being drivingly operatively connected to said input member.

27. A tuning assembly comprising an input member, an output member, a tuning element operatively connected to said output member to be positioned thereby in a plurality of tuning positions, and transmission means operatively connected between said members, detent means active on said input member in advance of said transmission means for detenting said input member in a plurality of operative positions with a predetermined degree of input member movement between said operative positions, said transmission means comprising a first part moved by said input member and a second part operatively connected to said output member, one of said parts comprising a plurality of stop surfaces and the other of said parts engaging said surfaces so as to locate said one part in one direction, and biasing means active on said other part to tend to move it in the opposite direction.

28. In the combination of claim 27, display means for identifying the operative tuning position of said tuning element, said display means drivingly operatively connected to said input member.

29. The tuning assembly of claim 11, in which said index means comprises a pair of coaxially mounted rotatable index plates operatively connected to said output member and each having a plurality of peripheral recesses defining said stop surfaces, said plates having their respective recesses circumferentially staggered relative to one another, and in which said actuator-driving means comprises a rotatably mounted crank having a pair of angularly related crank arms, each of said crank arms engaging with a different one of said index plates at said peripheral recesses and disengaging therefrom as said crank is rotated, one of said crank arms being engaged with its corresponding index plate when the other of said crank is disengaged from its corresponding index plate.

30. The tuning assembly of claim 29, in which said peripheral recesses are comprised by parts adjustably mounted on said index plates respectively, said biasing means urging said parts into engagement with said crank arms.

31. The tuning assembly comprising a rotatable input shaft, a rotatable output shaft, a tuning element operatively connected to said ouput shaft to be positioned thereby, biasing means active on said output shaft and effective to urge it to rotate in one direction, first and second index plates rotatable together and having peripheral recesses defining stop surfaces, the recesses of said plates respectively being circumferentially staggered, a crank shaft having a pair of angularly offset crank arms respectively engaging the recesses in said first and second index plates respectively, an operative connection between said index plates and said output shaft, said crank being rotatably mounted in line with the periphery of said index plates, and an operative connection between said input shaft and said crank shaft.

32. The tuning assembly of claim 31, in which said output shaft, said input shaft and said index plates are coaxially mounted.

33. In the tuning assembly of claim 31, detent means operatively connected to said input shaft in advance of said crank shaft.

34. In the tuning assembly of claim 33, tuning indicator means operatively connected to said input shaft in advance of said crank shaft.

35. In the tuning assembly of claim 31, tuning indicator means operatively connected to said input shaft in advance of said crank shaft.

36. In the tuning assembly of claim 31, limit stop means operatively connected to said input shaft in advance of said crank shaft.

37. The tuning assembly of claim 36, in which said limit stop means comprises a fixed limit stop element, a first part mounted for rotation adjacent said fixed element, a second part mounted for rotation adjacent said first part and carrying a cam, means operatively connecting said first and second parts with said input shaft, a cam follower carried by said first part normally out of the path of said fixed element but movable by said cam into the path of said fixed element, and means for rotating said first and second parts at different rotational speeds relative to said input shaft, said cam being so related in terms of rotational position and circumferential extent to the different speeds of rotation of said first and second parts as to project said follower into engagement with said fixed stop element at the desired extreme degree of rotation of said input shaft.

38. In the tuning assembly of claim 36, detent means operatively connected to said input shaft in advance of said crank shaft.

39. In the tuning assembly of claim 31, fine tuning means interposed between said index plates and said output shaft, and a fine tuning shaft operatively connected to said fine tuning means.

40. The tuning assembly of claim 39, in which said input shaft and said index plates are freely rotatably mounted on said fine tuning shaft.

41. The tuning assembly of claim 39, in which said input shaft, said index plates and said output shaft are freely rotatably mounted on said fine tuning shaft.

42. The tuning assembly of claim 41, in which said index plates are connected together to define an index plate assembly and said fine tuning means is housed within said assembly.

43. The tuning assembly of claim 42, in which said fine tuning means comprises a cam operatively connected to said fine tuning shaft, an arm articulately mounted on said index plates for rotation therewith and for movement relative thereto and having a part engaging said cam, said cam being effective when it is moved by said fine tuning shaft to cause said arm to move relative to said index plates, and a movement-transmitting connection between said arm and said output shaft.

44. The tuning assembly of claim 39, in which said index plates are connected together to define an index assembly and said fine tuning means is housed within said assembly.

45. The tuning assembly of claim 44, in which said fine tuning means comprises a cam operatively connected to said fine tuning shaft, an arm articulately mounted on said index plates for rotation therewith and for movement relative thereto and having a part engaging said cam, said cam being effective when it is moved by said fine tuning shaft to cause said arm to move relative to said index plates, and a movement-transmitting connection between said arm and said output shaft.

46. The tuning assembly of claim 39, in which said fine tuning means comprises a cam operatively connected to said fine tuning shaft, an arm articulately mounted on said index plates for rotation therewith and for movement relative thereto and having a part engaging said cam, said cam being effective when it is moved by said fine tuning shaft to cause said arm to move relative to said index plates, and a movement-transmitting connection between said arm and said output shaft.

References Cited

The following references, cited by the Examiner, are of record in the patented file of this patent or the original patent.

UNITED STATES PATENTS

| | | | |
|---|---|---|---|
| 480,671 | 8/1892 | Richards | 74—435 |
| 2,625,632 | 1/1953 | Onia et al. | 74—10.41 X |
| 3,170,333 | 2/1965 | Umbricht | 74—84 |
| 3,248,953 | 5/1966 | Holper et al. | 74—10.15 |
| 3,307,414 | 3/1967 | Naber et al. | 74—10.41 |
| 3,572,135 | 3/1971 | Williams | 74—10.54 |
| 3,618,405 | 11/9171 | Ishida | 74—10.54 |
| 3,706,232 | 12/1972 | Robertson | 74—10.54 |

FOREIGN PATENTS

| | | | |
|---|---|---|---|
| 1,126,502 | 9/1968 | Great Britain | 74—10.41 |

ALLAN D. HERRMANN, Primary Examiner

U.S. Cl. X.R.

74—10.41, 10.54, 10.8, 116